US008910098B1

(12) United States Patent
Lei et al.

(10) Patent No.: US 8,910,098 B1
(45) Date of Patent: Dec. 9, 2014

(54) NEIGHBOR-AWARE EDGE FRAGMENT ADJUSTMENT FOR OPTICAL PROXIMITY CORRECTION

(71) Applicant: Mentor Graphics Corporation, Wilsonville, OR (US)

(72) Inventors: Junjiang Lei, Fremont, CA (US); Le Hong, West Linn, OR (US); Georg P. Lippincott, Lake Oswego, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 14/183,209

(22) Filed: Feb. 18, 2014

(51) Int. Cl.
*G06F 17/50* (2006.01)

(52) U.S. Cl.
CPC ................................. *G06F 17/5081* (2013.01)
USPC .................. 716/106; 716/51; 716/53; 716/55

(58) Field of Classification Search
USPC ........................................ 716/51, 53, 55, 106
See application file for complete search history.

(56) References Cited

U.S. PATENT DOCUMENTS

| 6,928,634 | B2 | | 8/2005 | Granik et al. | |
|---|---|---|---|---|---|
| 7,013,439 | B2 | * | 3/2006 | Robles et al. | 716/53 |
| 7,237,221 | B2 | | 6/2007 | Granik et al. | |
| 7,280,945 | B1 | * | 10/2007 | Weiner et al. | 703/2 |
| 7,293,249 | B2 | * | 11/2007 | Torres Robles et al. | 716/53 |
| 7,861,207 | B2 | * | 12/2010 | Word et al. | 716/55 |
| 8,108,806 | B2 | * | 1/2012 | Robles et al. | 716/53 |
| 8,539,391 | B2 | * | 9/2013 | Lei et al. | 716/53 |
| 8,566,753 | B2 | * | 10/2013 | Word et al. | 716/50 |
| 2013/0198698 | A1 | * | 8/2013 | Lei et al. | 716/53 |

OTHER PUBLICATIONS

Banerjee et al., "Electrically Driven Optical Proximity Correction Based on Linear Programming", 2008, IEEE/ACM International Conference on Computer-Aided Design, Conference Publication pp. 473-479.*
Nick Cobb and Granik Yuri, "Model-based OPC using the MEEF matrix,", 22nd Annual BACUS Symposium on Photomask Technology, Proceedings of SPIE vol. 4889 (2002).
Ye Chen, Kechih Wu, Zheng Shi and Xiaolang Yan, "A Feasible Model-Based OPC Algorithm Using Jacobian Matrix of Intensity Distribution Functions," Proceedings of SPIE vol. 6520 (2007).
L. Pang, G. Xiao, V. Tolani, P. Hu, T. Cecil, T. Dam, K.H. Baik, B. Gleason, "Considering MEEF in Inverse Lithography Technology and Source Mask Optimization," Proceedings of SPIE vol. 7122 (2008).

* cited by examiner

*Primary Examiner* — Sun Lin

(57) ABSTRACT

Aspects of the invention relate to techniques for applying edge fragment correlation information to optical proximity correction. Neighbor-aware edge adjustment values for the edge fragments are computed based on edge placement error values and edge fragment correlation information. The computation comprises: selecting a group of edge fragments around a center edge fragment, calculating preliminary neighbor-aware edge adjustment values based on the edge placement error values and the edge fragment correlation information for the group of edge fragments, storing the preliminary neighbor-aware edge fragment adjustment value for the center edge fragment, and repeating the selecting, the calculating and the storing with each of the edge fragments being the center edge fragment. The computed neighbor-aware edge adjustment values are combined with conventional edge adjustment values and the edge fragments are adjusted accordingly. The process may be repeated for a number of times.

30 Claims, 7 Drawing Sheets

Flow chart 700

NEIGHBOR-AWARE EDGE FRAGMENT ADJUSTMENT FOR OPTICAL PROXIMITY CORRECTION

FIELD OF THE INVENTION

The present invention relates to the field of lithography. Various implementations of the invention may be particularly useful for optical proximity correction.

BACKGROUND OF THE INVENTION

Electronic circuits, such as integrated circuits (ICs), are used in a variety of products, from automobiles to microwaves to personal computers. Designing and fabricating IC devices typically involves many steps, sometimes referred to as the "design flow." The particular steps of a design flow often are dependent upon the type of the circuit, its complexity, the design team, and the circuit fabricator or foundry that will manufacture the circuit. Typically, software and hardware "tools" verify the design at various stages of the design flow by running software simulators and/or hardware emulators. These steps aid in the discovery of errors in the design, and allow the designers and engineers to correct or otherwise improve the design.

Several steps are common to most design flows. Initially, the specification for a new circuit is transformed into a logical design, such as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing IC components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks.

Circuit layout descriptions can be provided in many different formats. The Graphic Data System II (GDSII) format is a popular format for transferring and archiving two-dimensional (2D) graphical circuit layout data. Among other features, it contains a hierarchy of structures, each structure containing layout elements (e.g., polygons, paths or polylines, circles and textboxes). Other formats include an open source format named Open Access, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in design layouts that are employed to manufacture integrated circuits. Once the design is finalized, the layout portion of the design can be used by fabrication tools to manufacture the circuit using a photolithographic process.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask must be created to expose only the desired areas to the radiation, and to protect the other areas from exposure. The mask is created from circuit layout data. That is, the geometric elements described in a design layout define the relative locations or areas of the circuit that will be exposed to radiation through the mask. A mask or reticle writing tool is used to create the mask based upon the design layout, after which the mask can be used in a photolithographic process.

As designers and manufacturers continue to increase the number of circuit components in a given area and/or shrink the size of circuit components, the shapes reproduced on the substrate (and thus the shapes in the mask) become smaller and are placed closer together. This reduction in feature size increases the difficulty of faithfully reproducing the image intended by the design layout onto the substrate. The diffractive effects of light often result in defects where the intended image is not accurately "printed" onto the substrate during the photolithographic process, creating flaws in the manufactured device. One or more resolution enhancement techniques (RETs) are often employed to improve the resolution of the image that the mask forms on the substrate during the photolithographic process. Examples of various resolution enhancement techniques are discussed in "Resolution Enhancement Technology: The Past, the Present, and Extensions for the Future," Frank M. Schellenberg, Optical Microlithography XVII, edited by Bruce W. Smith, Proceedings of SPIE Vol. 5377, which article is incorporated entirely herein by reference. One of these techniques, "optical proximity correction" or "optical process correction" (OPC), adjusts the amplitude of the light transmitted through a lithographic mask by modifying the design layout data employed to create the mask.

In a conventional OPC process, the edges of the geometric elements in the design are fragmented. For example, as shown in FIG. 3A, an edge of the geometric element 301 used to create a mask feature 300 may be fragmented into edge fragments 301A-301F. The size of the edge fragments in a given layout design depends upon the OPC process parameters, often referred to as the OPC recipe. The "recipe" specifies the size of the edge fragments. While not all edges within a layout design are fragmented in every OPC process, these edges may also be referred to as edge fragments.

The model-based OPC process also simulates the printed image. That is, the photolithographic process is simulated in order to produce a simulated printed image (referred to as simulated image), such as the example image 302 shown in FIG. 3A. This simulated image is compared to the target image. Typically, this comparison is done at each edge fragment. For example, as shown in FIG. 3C, the target image is a distance d1 away from the simulated image at the edge fragment 301A, the target image is a distance d2 away from the simulated image at the edge fragment 301C, while the target image intersects the simulated image at the edge fragment 301B. The distances between the target image and the simulated image are often referred to as the edge placement error (EPE). Accordingly, in most conventional model-based OPC processes each edge fragment or unfragmented edge has an associated edge placement error (also referred to as an associated edge placement error value).

Next, the edge fragments are individually moved or adjusted in order to enable the simulated image for the resulting mask to reproduce the target image as much as possible. For example, as shown in FIG. 3D, the edge fragment 201A is displaced in a direction away from the geometric element 301, in an effort to widen the corresponding portion of the image that would be produced by the resulting mask. Similarly, the edge fragment 301C is displaced in a direction toward from the geometric element 301, in an effort to narrow the corresponding portion of the image that would be produced by the resulting mask. Next, the image that would be produced by a mask using the displaced edge fragments is simulated, and the new simulated image is compared with the target image, and the edge placement error for each edge fragment is computed.

This process of moving the edge fragments, simulating the image that would be produced using the moved edge fragments, and comparing the simulated image to the target image may be repeated a number of times. Each cycle of moving edge fragments and comparing the new simulated image to target image is referred to as an iteration of the OPC process. Typically, edge fragments moved during a given iteration, and the distance the edge fragments are displaced, are determined based upon the edge placement error. For example, because d1 is larger than d2 in FIG. 3C, a subsequent iteration of the optical proximity correction process may move edge fragment 301A a greater amount than edge fragment 301C.

Traditionally, the movement value for each edge fragment may be the edge placement error multiplied by a constant factor (feedback factor). This feedback factor may be location dependent or edge type dependent based on the OPC recipe. The OPC iteration process continues until the simulated image is sufficiently similar to the target image (e.g., both d1 and d2 are smaller than a threshold value), or until it is determined that the displacements of the edge fragments already have converged on locations where no further movement of the edge fragments will improve the simulated image. Once the final positions of the edge fragments are determined in the layout design data, as shown in FIG. 3D, a modified mask feature 303 can be created from the corrected layout design data. As shown in FIG. 3D, the image 304 produced by the modified mask feature 303 should more closely correspond to the target image.

The traditional approach was successful at earlier technology nodes where the EPE of a given fragment was primarily governed by its own displacement, and not so much by the movement of other neighboring fragments. However, OPC convergence is substantially more difficult to achieve in advanced technology nodes such as 28 nm and below. The influence of many neighboring fragments on any particular fragment increases significantly because the size of a whole printed geometric element may be a fraction of the exposure light wavelength. While an increased number of OPC iterations may help, more OPC iterations results in very long OPC runtime. Moreover, OPC convergence may not be achieved in some locations no matter how many OPC iterations are employed. Edge fragment correlation information such as the cross-Mask Error Enhancement Factor (cross-MEEF) may be employed to improve OPC convergence. Challenges remain in incorporating edge fragment correlation information into an OPC process.

BRIEF SUMMARY OF THE INVENTION

Aspects of the invention relate to techniques for applying edge fragment correlation information to optical proximity correction. With various implementations of the invention, edge placement error values for edge fragments in a layout design are first determined based on simulation. The layout design may be associated with a whole or a portion of a circuit design. The layout design may be preliminarily treated by a conventional OPC process. Edge fragment correlation information for the edge fragments may also be used for the determination of edge placement error values.

Based on the edge placement error values and the edge fragment correlation information, neighbor-aware edge adjustment values for the edge fragments are computed. The computation comprises: selecting a group of edge fragments from the edge fragments, the group of edge fragments comprising a center edge fragment and edge fragments neighboring the center edge fragment determined based on a predetermined condition; calculating preliminary neighbor-aware edge adjustment values based on the edge placement error values for the group of edge fragments and the edge fragment correlation information for the group of edge fragments; storing the preliminary neighbor-aware edge adjustment values for the center edge fragment or a plurality of edge fragments as the neighbor-aware edge adjustment values for the center edge fragment or the plurality of edge fragments, the plurality of edge fragments being a subgroup of edge fragments in the group of edge fragments that include the center edge fragment; and repeating the selecting, the calculating and the storing for different groups of edge fragments.

The computation may further be based on one or more constraints, the one or more constraints comprising maximum value or values for the preliminary neighbor-aware edge adjustment values, constraints defined by mask rule checking, or both. For example, the computation may further comprise modifying the neighbor-aware edge adjustment values if necessary based on the constraints defined by mask rule checking.

The neighbor-aware edge adjustment values may be combined with conventional edge adjustment values to derive combined neighbor-aware edge adjustment values for the edge fragments. The conventional edge adjustment values can be derived by any conventional OPC process such as multiplying the edge placement error values by a feedback factor. The feedback factor may be location dependent or edge type dependent.

The combination operation may comprise averaging the neighbor-aware edge adjustment values and the conventional edge adjustment values based on a weight factor. The weight factor may be location dependent or edge type dependent. The combined neighbor-aware edge adjustment values may be modified if necessary based on constraints comprising mask rule checking.

According to the combined neighbor-aware edge adjustment values, the edge fragments in the layout design may be adjusted to derive adjusted edge fragments. Using the adjusted edge fragments to replace the edge fragments, the above whole process may be repeated.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

DETAILED DESCRIPTION OF THE INVENTION

General Considerations

Figure 1:
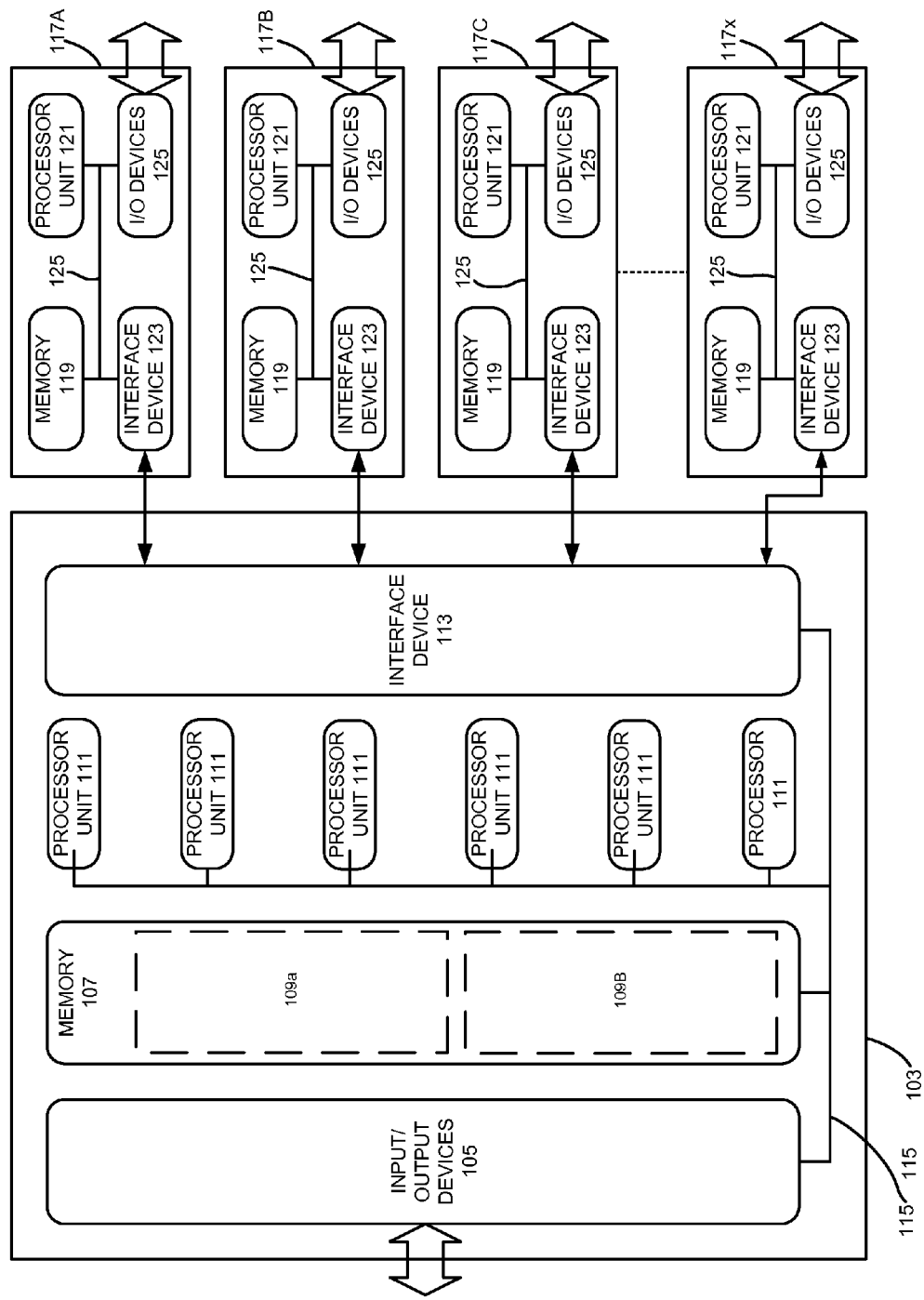
FIG. 1 illustrates an example of a computing system that may be used to implement various embodiments of the invention.

Various aspects of the present invention relate to techniques for applying edge fragment correlation information to optical proximity correction. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "determine", "compute" and "calculate" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Illustrative Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of concurrently running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
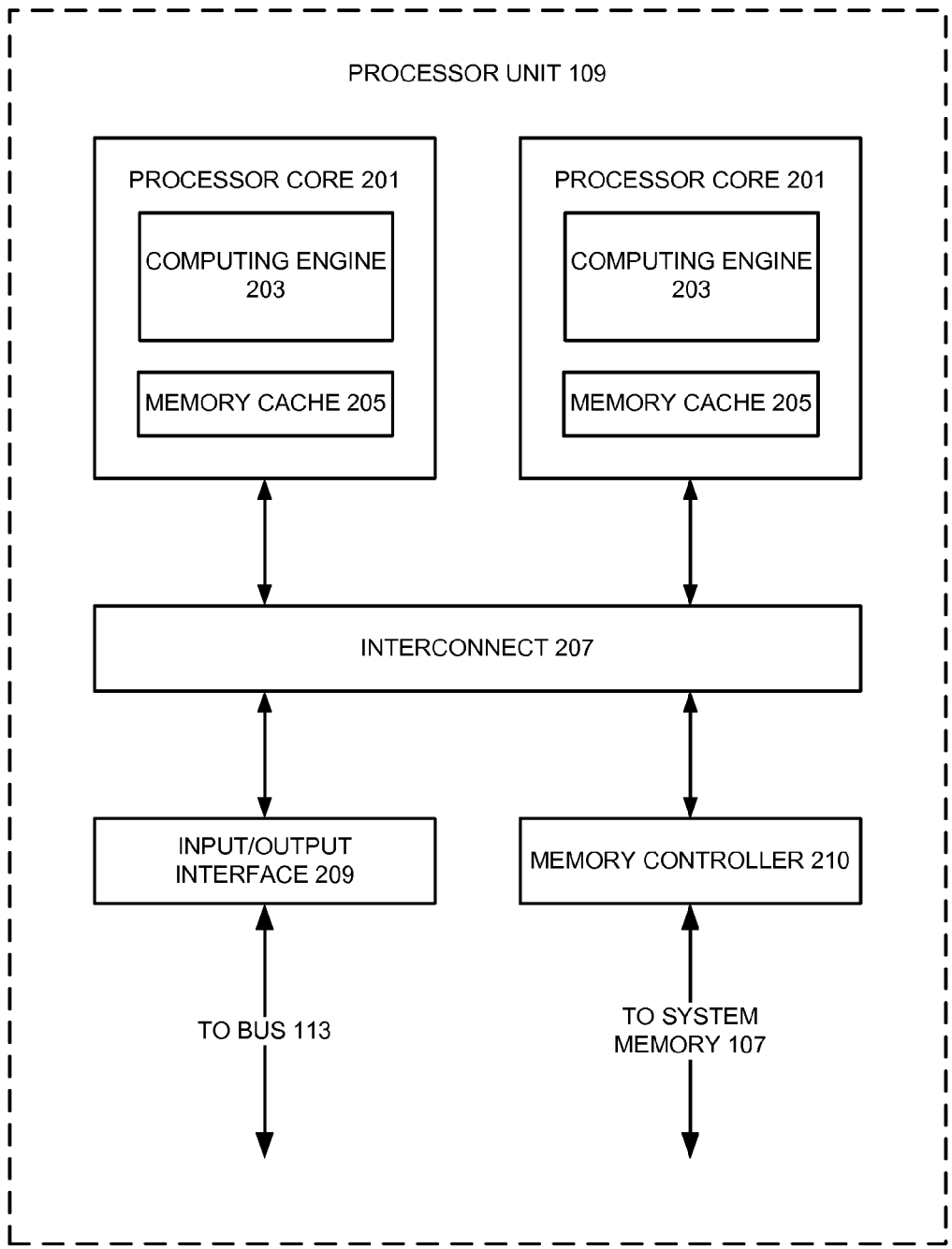
FIG. 2 illustrates an example of a multi-core processor unit that may be used to implement various embodiments of the invention.
Figure 3A:
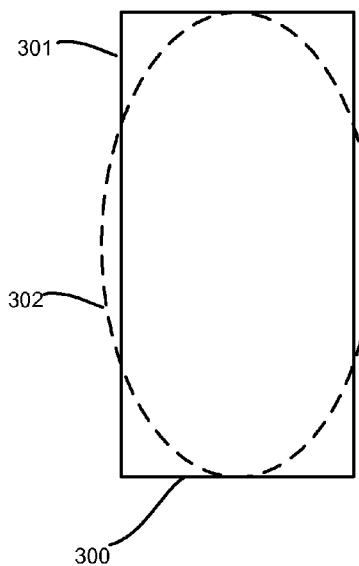
FIG. 3A illustrates a mask feature 300 and a simulated image of the mask feature.
Figure 3C:
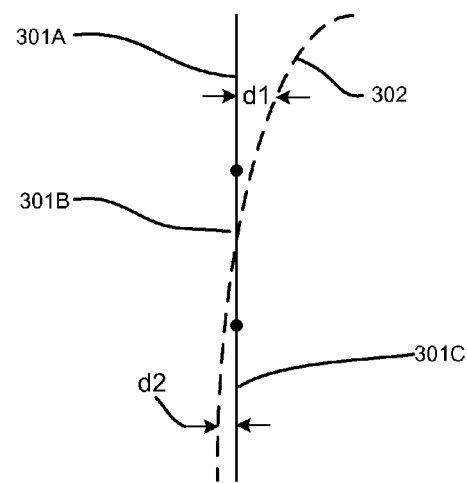
FIG. 3C illustrates edge displacement errors for some of the edge fragments.
Figure 3B:
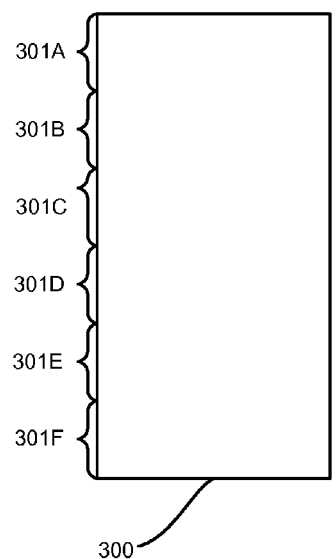
FIG. 3B illustrates an example of fragmentation of an edge of the mask feature 300.
Figure 3D:
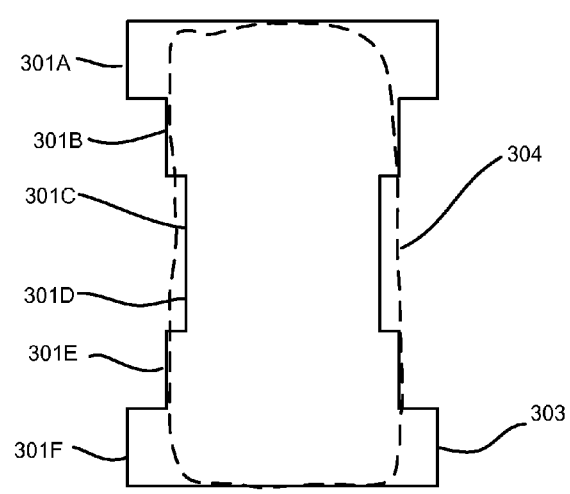
FIG. 3D illustrates a mask feature modified from the mask feature 300 by an OPC process and a corresponding simulated image.

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the invention, the processor units 111 may include additional components, such as a high-level cache memory accessible shared by the processor cores 201.

While FIG. 2 shows one illustration of a processor unit 111 that may be employed by some embodiments of the invention, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Cross-Mask Error Enhancement Factor

The mask error enhancement factor (MEEF) is used to describe the deviation from the idea pattern found on the reticle, to the deviation produced in the corresponding patterning pattern on the wafer. This is mathematically expressed as:

$$MEEF = \frac{\partial CD_{wafer}}{\partial (CD_{reticle}/M)} \quad [1]$$

where M is the imaging system reduction ratio. For an ideal linear imaging system, MEEF=1.0. In practice, process-related and mask-related variables can significantly enhance the MEEF as the image fidelity of the system deteriorates.

As noted above, the movement value for each edge fragment during an OPC iteration may be the edge placement error multiplied by a constant factor (feedback factor). This feedback factor may be derived based on the MEEF. In traditional OPC processes, the MEEF is usually determined without considering proximity interactions between features. To account for the proximity interactions, the MEEF may be represented by a matrix:

$$MEEM \equiv F'(0) = \begin{bmatrix} \frac{\partial w_1}{\partial m_1} & \frac{\partial w_1}{\partial m_2} & \cdots & \frac{\partial w_1}{\partial m_n} \\ \frac{\partial w_2}{\partial m_1} & \frac{\partial w_2}{\partial m_2} & \cdots & \frac{\partial w_2}{\partial m_n} \\ \cdots & \cdots & \cdots & \cdots \\ \frac{\partial w_r}{\partial m_1} & \frac{\partial w_r}{\partial m_1} & \cdots & \frac{\partial w_r}{\partial m_n} \end{bmatrix} \quad [2]$$

where $\partial m_1, \partial m_2, \ldots, \partial m_n$ are mask distortions (or $dCD_{reticle}$) for features 1–n and $\partial w_1, \partial w_2, \ldots \partial w_r$ are image distortions (or $dCD_{wafer}$) for features 1–r. The coefficients $\partial w_i/\partial m_i$ are coefficients of error self-enhancements describe the influence of mask edge shifts on the corresponding wafer edges—employed by traditional OPC processes. They are usually positioned diagonally in the matrix. Off-diagonal elements $\partial w_i/\partial m_j$ are coefficients of cross-enhancements, characterizing the influence of mask edge shifts on the neighboring wafer edges—edge fragment correlation. These off-diagonal elements are often referred to as cross-MEEF. A MEEF matrix is usually a diagonal dominant matrix because self-enhancement is a stronger phenomenon than cross-enhancement.

Figure 4:
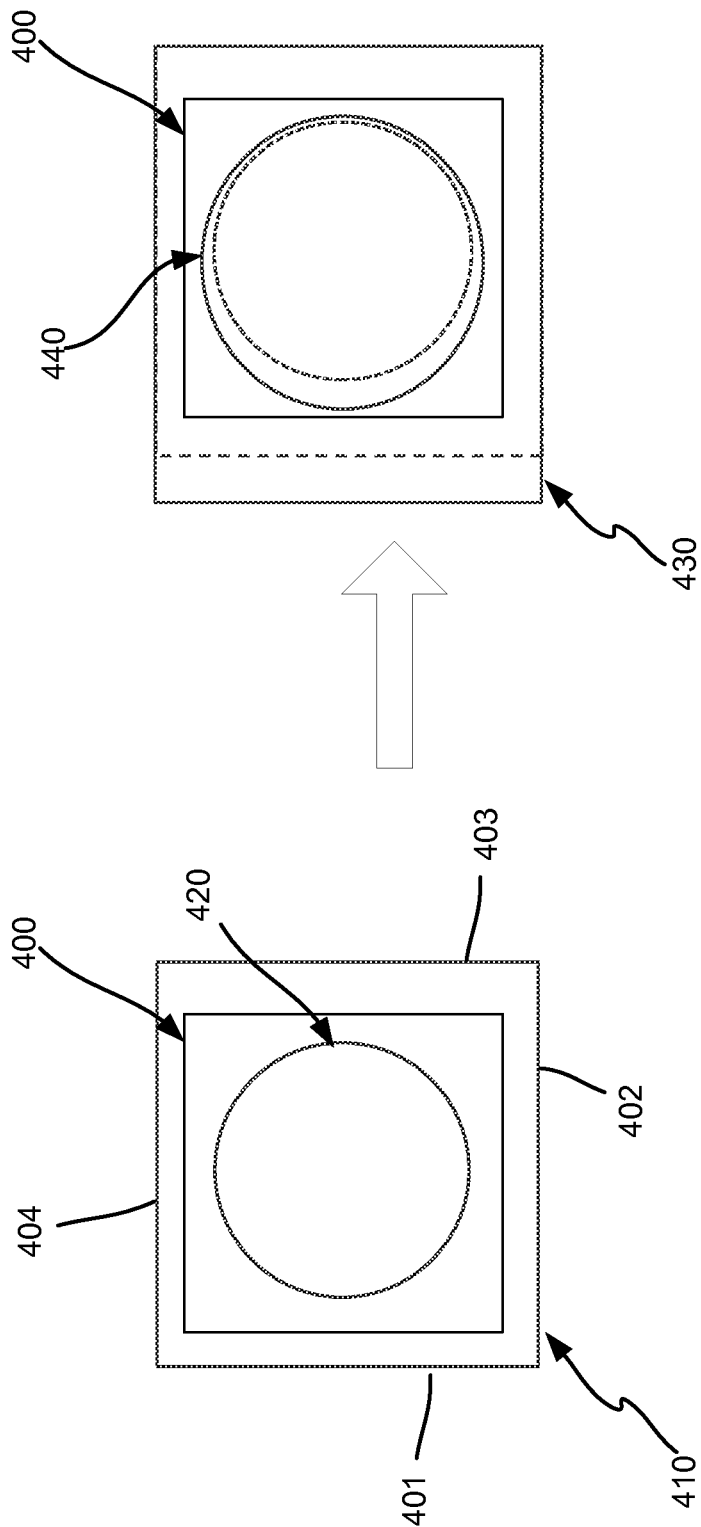
FIG. 4 illustrates an example how displacing one edge fragment can affect printed images of neighboring edge fragments.

FIG. 4 illustrates an example of edge fragment correlation. Square 400, square 410 and circle 420 are a target wafer feature, a corresponding mask feature and a simulated wafer feature, respectively. If edge 401 of the square 410 is moved outward by 1 nm, the mask feature becomes square 430 and corresponding simulated wafer feature becomes feature 440. As a result, EPE changes for edges 401-404 are 0.5 nm, 0.2 nm, 0.1 nm and 0.2 nm, respectively. This illustrates edge fragment correlation—the movement of edge 401 causes EPE changes for all four edges 401-404. This process may be represented by an equation including a MEEF matrix:

$$\begin{pmatrix} 0.5 & 0.2 & 0.1 & 0.2 \\ 0.2 & 0.5 & 0.2 & 0.1 \\ 0.1 & 0.2 & 0.5 & 0.2 \\ 0.2 & 0.1 & 0.2 & 0.5 \end{pmatrix} * \begin{pmatrix} m1 \\ m2 \\ m3 \\ m4 \end{pmatrix} = \begin{pmatrix} -epe1 \\ -epe2 \\ -epe3 \\ -epe4 \end{pmatrix} \quad [3]$$

Eq. 3 shows mask edge displacements may be derived based on desired EPEs and a corresponding MEEF matrix. To determine the MEEF, the cross-MEEF needs to be determined first.

The cross-MEEF may be determined by using an equation or by simulation. The cross-MEEF may also be determined based on image intensity slope information and image amplitude sensitivity information as discussed in U.S. Pat. No. 8,539,391, which is incorporated herein by reference.

Neighbor-Aware Edge Adjustment Tools And Methods

Figure 5:
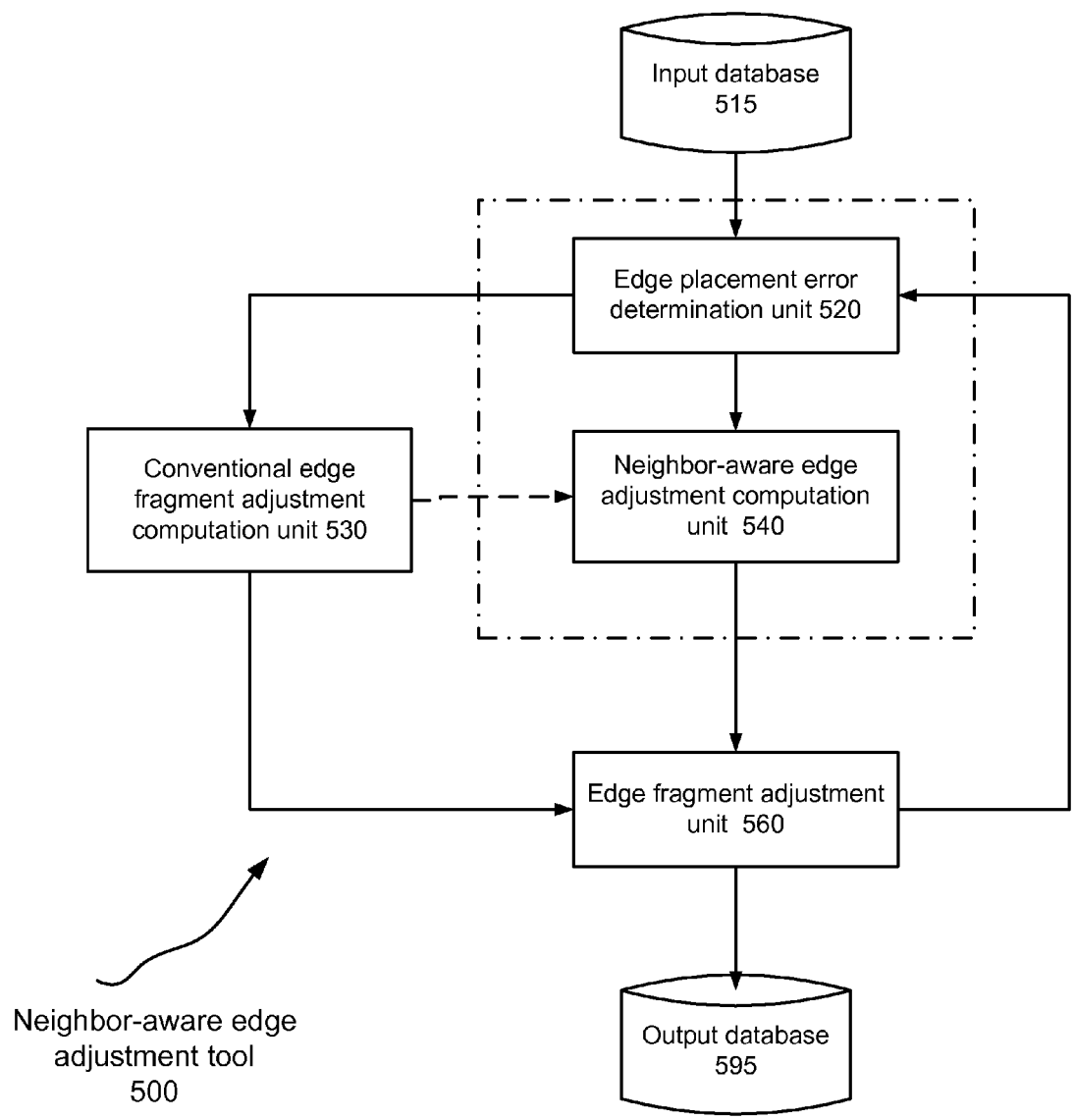
FIG. 5 illustrates an example of a neighbor-aware edge adjustment tool that may be employed according to various embodiments of the invention.

FIG. 5 illustrates an example of a neighbor-aware edge adjustment tool according to various embodiments of the invention. As seen in the figure, the neighbor-aware edge adjustment tool 500 includes two units: an edge placement error determination unit 520 and a neighbor-aware edge adjustment computation unit 540. Some implementations of the edge fragment correlation determination tool 500 may cooperate with (or incorporate) one or more of an input database 515, an output database 595, a conventional edge fragment adjustment computation unit 530 and an edge fragment adjustment unit 560.

As will be discussed in more detail below, the edge placement error determination unit 520 determines edge placement error values for edge fragments in a layout design based on simulation. The neighbor-aware edge adjustment computation unit 540 then computes neighbor-aware edge adjustment values for the edge fragments based on the edge placement error values and edge fragment correlation information. The conventional edge fragment adjustment computation unit 530 derives conventional edge adjustment values from the edge placement error values. The edge fragment adjustment unit 560 combines the neighbor-aware edge adjustment values with the conventional edge adjustment values to derive combined neighbor-aware edge adjustment values and adjusts the edge fragments accordingly. In some embodiments of the invention, the adjusted edge fragments outputted by the edge fragment adjustment unit 560 are used as the input of the edge placement error determination unit 520 and the above process is repeated. The conventional edge adjustment values outputted by the conventional edge fragment adjustment computation unit 530 may also be used by the neighbor-aware edge adjustment computation unit 540.

As previously noted, various examples of the invention may be implemented by a multiprocessor computing system, such as the computing system illustrated in FIGS. 1 and 2. Accordingly, one or more of the edge placement error determination unit 520, the neighbor-aware edge adjustment computation unit 540, the conventional edge fragment adjustment computation unit 530 and the edge fragment adjustment unit 560 may be implemented by executing programming instructions on one or more processors in a computing system such as the computing system illustrated in FIG. 1 and FIG. 2. Correspondingly, some other embodiments of the invention may be implemented by software instructions, stored on a non-transitory computer-readable medium, for instructing one or more programmable computers/computer systems to perform the functions of one or more of the edge placement error determination unit 520, the neighbor-aware edge adjustment computation unit 540, the conventional edge fragment adjustment computation unit 530 and the edge fragment adjustment unit 560. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

It also should be appreciated that, while the edge placement error determination unit 520, the neighbor-aware edge adjustment computation unit 540, the conventional edge fragment adjustment computation unit 530 and the edge fragment adjustment unit 560 are shown as separate units in FIG. 5, a single servant computer (or a single processor within a master computer) may be used to implement two or more of these units at different times, or components of two or more of these units at different times.

With various examples of the invention, the input database 515 and the output database 595 may be implemented using any suitable computer readable storage device. That is, either of the input database 515 and the output database 595 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, punched media, holographic storage devices, or any other non-transitory storage medium that can be used to store desired information. While the input database 515 and the output database 595 are shown as separate units in FIG. 5, a single data storage medium may be used to implement some or all of these databases.

Figure 6:
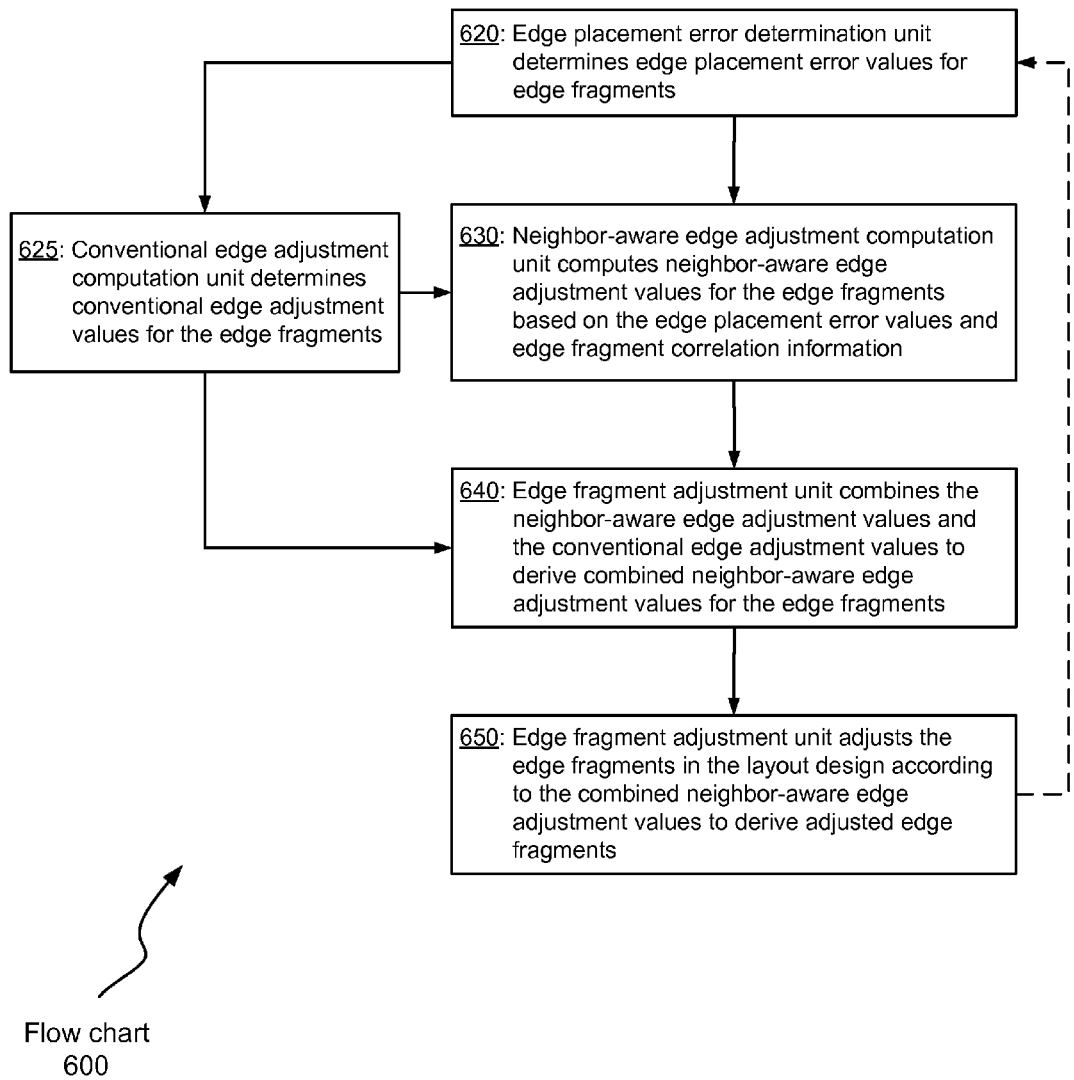
FIG. 6 illustrates a flowchart describing neighbor-aware edge adjustment methods that may be employed by various embodiments of the invention.

FIG. 6 illustrates a flowchart showing a process for neighbor-aware edge adjustment that may be implemented according to various examples of the invention. For ease of understanding, neighbor-aware edge adjustment methods that may be employed according to various embodiments of the invention will be described with reference to the neighbor-aware edge adjustment tool 500 illustrated in FIG. 5 and the flow chart 600 in FIG. 6. It should be appreciated, however, that alternate implementations of a neighbor-aware edge adjustment tool may be used to perform the neighbor-aware edge adjustment method shown in the flow chart 600 according to various embodiments of the invention. In addition, it should be appreciated that implementations of the neighbor-aware edge adjustment tool 500 may be employed to implement neighbor-aware edge adjustment methods according to different embodiments of the invention other than the one illustrated by the flow chart 600 in FIG. 6.

Initially, in operation 620, the edge placement error determination unit 520 determines edge placement error values for edge fragments in a layout design based on simulation. The layout design may be associated with a whole or a portion of a circuit design. The layout design may also be derived by performing one or more conventional optical proximity correction iterations on an original layout design. As discussed previously, edges of the geometric elements in the layout design are fragmented into the edge fragments for optical proximity correction. The edge placement error value for an edge fragment is determined based on the distance between the target image and the simulated image of the edge fragment. Lithographic simulators used in various commercial EDA tools such as the CALIBRE family of software tools available from Mentor Graphics Corporation, Wilsonville, Oreg., may be incorporated in or otherwise employed by the edge placement error determination unit 520 for simulation.

In some embodiments of the invention, the edge placement error determination unit 520 determines edge placement error values for edge fragments in a layout design also based on the edge fragment correlation information. For example, the edge placement error determination unit 520 first derives preliminary edge placement error values from the distances between the target image and the simulated image. The edge placement error determination unit 520 then uses cross-Mask Error Enhancement Factor information or image amplitude sensitivity information as weight factors to calculate weighted averages of the preliminary edge placement error values of neighboring edge fragments. For an edge fragment, edge fragments neighboring the edge fragment may be determined based on a predetermined condition. One example of the predetermined condition is a certain number of edge fragments closest to the edge fragment. Another example may be a predefined distance. This weighted averaging method may be applied to the whole layout design or only to certain layout regions or features.

Figure 7:
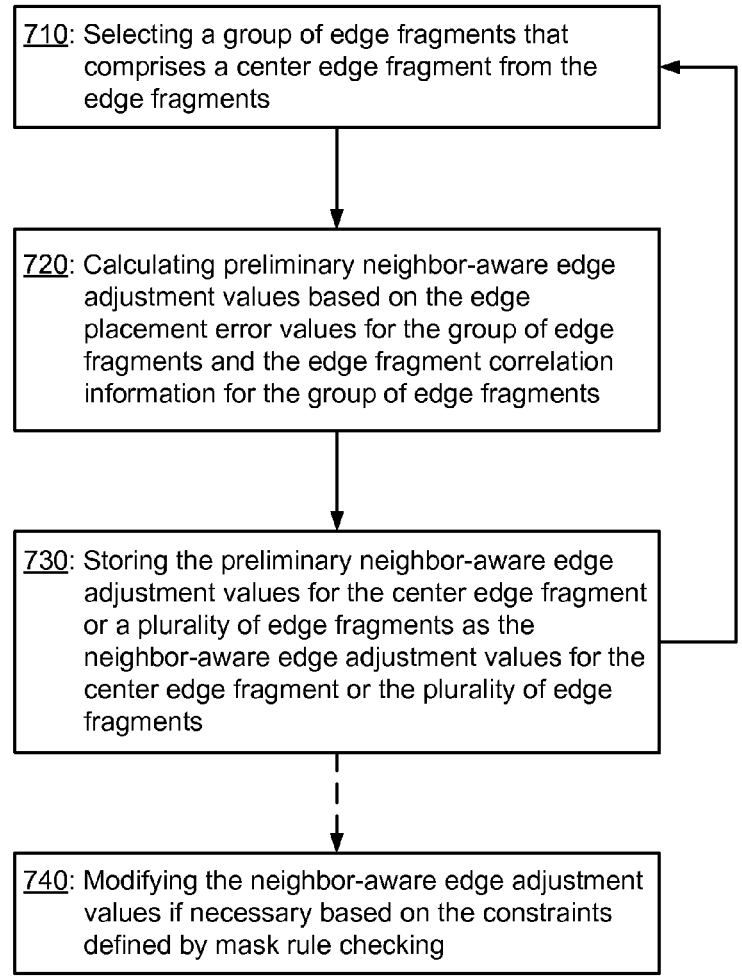
FIG. 7 illustrates a flowchart describing neighbor-aware edge fragment adjustment value computation methods that may be employed by various embodiments of the invention.

Next, in operation 630, the neighbor-aware edge adjustment computation unit 540 computes neighbor-aware edge adjustment values for the edge fragments based on the edge placement error values and the edge fragment correlation information. The computation comprises sub-operations illustrated by first three operations of a flowchart 700 in FIG. 7. In operation 710, a group of edge fragments from the edge fragments are selected. The group of edge fragments comprises a center edge fragment and edge fragments neighboring the center edge fragment determined based on a predetermined condition. This predetermined condition may be the same as or different from the one used by the edge placement error determination unit 520 in the operation 620.

In operation 720, preliminary neighbor-aware edge adjustment values are calculated based on the edge placement error values for the group of edge fragments and the edge fragment correlation information for the group of edge fragments. With various implementations of the invention, the edge placement error determination unit 520 performs the calculation by solving a linear equation AX=B similar to Eq. (3), where A represents the MEEF matrix for the group of edge fragments and B represents the edge placement error values for the group of edge fragments to be minimized. Standard mathematic methods such as Gaussian elimination, matrix inversion, the least square method, Gauss-Seidel iteration, Jacobian iteration and their variants may be employed.

In operation 730, the preliminary neighbor-aware edge adjustment values for the center edge fragment or a plurality of edge fragments are stored as or for determining the neighbor-aware edge adjustment values for the center edge fragment or for the plurality of edge fragments. The plurality of edge fragments is a subgroup of edge fragments in the group of edge fragments that include the center edge fragment. The operations 710-730 are then repeated for different groups of edge fragments.

In some embodiments of the invention, for example, the preliminary neighbor-aware edge fragment adjustment value for the center edge fragment is stored as the neighbor-aware edge fragment adjustment value and those for the rest are discarded. The operations 710-730 are repeated with each of the edge fragments serving as the center edge fragment.

The computation performed by the neighbor-aware edge adjustment computation unit 540 is further based on one or more constraints. The one or more constraints comprises maximum value or values for the preliminary neighbor-aware edge adjustment values, constraints defined by mask rule checking, or both. For example, the neighbor-aware edge adjustment computation unit 540 may performs an operation 740 of the flowchart 7 in addition to the operations 710-730: modifying the neighbor-aware edge adjustment values if necessary based on the constraints defined by mask rule checking. The operation 740 does not need to be performed after the operation 730, but may be performed concurrently with the operation 730 or the operation 720.

Next, in operation 625, the conventional edge fragment adjustment computation unit 530 determines conventional edge adjustment values for the edge fragments. The conventional edge adjustment values may be derived by a process comprising multiplying the edge placement error values by a feedback factor. The feedback factor may be location dependent or edge type dependent. More complex methods employed by various commercial tools may be implemented as well. This operation may be performed before, concurrently with or after the operation 630. Some of the computation methods employed in the operation 630 by the neighbor-aware edge adjustment computation unit 540 may need initial values for the preliminary neighbor-aware edge adjustment values. The conventional edge adjustment values determined in the operation 625 may be used for the purpose and supplied to the operation 630 as indicated in the flowchart 600.

Next, in operation 640, the edge fragment adjustment unit 560 combines the neighbor-aware edge adjustment values and the conventional edge adjustment values to derive combined neighbor-aware edge adjustment values for the edge fragments. The combination may comprise averaging the neighbor-aware edge adjustment values and the conventional edge adjustment values based on a weight factor. The weight factor may be location dependent or edge type dependent. The combined neighbor-aware edge adjustment values may be modified if necessary based on constraints comprising mask rule checking.

Next, in operation 650, the edge fragment adjustment unit 560 adjusts the edge fragments in the layout design according to the combined neighbor-aware edge adjustment values to derive adjusted edge fragments. With some implementations of the invention, the neighbor-aware edge adjustment tool 500 repeats the operations of the flowchart 600 by using the adjusted edge fragments to replace the edge fragments. This iteration may be performed for more than once. The weight factor used in operation 640 may be varied for different iterations.

The above disclosed neighbor-aware edge adjustment process may be combined with a conventional OPC process. For example, a conventional OPC process may be performed for a number of iterations before performing the neighbor-aware edge adjustment process for one or more iterations.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A method, executed by at least one processor of a computer, comprising:
    determining edge placement error values for edge fragments in a layout design based on simulation; and
    computing neighbor-aware edge adjustment values for the edge fragments based on the edge placement error values and edge fragment correlation information, wherein the computing comprises:
    selecting a group of edge fragments from the edge fragments, the group of edge fragments comprising a center edge fragment and edge fragments neighboring the center edge fragment determined based on a predetermined condition,
    calculating preliminary neighbor-aware edge adjustment values based on the edge placement error values for the group of edge fragments and the edge fragment correlation information for the group of edge fragments,
    storing the preliminary neighbor-aware edge adjustment values for the center edge fragment or a plurality of edge fragments as the neighbor-aware edge adjustment values for the center edge fragment or the plurality of edge fragments, the plurality of edge fragments being a subgroup of edge fragments in the group of edge fragments that include the center edge fragment, and
    repeating the selecting, the calculating and the storing for different groups of edge fragments.

2. The method recited in claim 1, wherein the repeating is performed with each of the edge fragments serving as the center edge fragment.

3. The method recited in claim 1, further comprising:
combining the neighbor-aware edge adjustment values and conventional edge adjustment values to derive combined neighbor-aware edge adjustment values for the edge fragments.

4. The method recited in claim 3, further comprising:
adjusting the edge fragments in the layout design according to the combined neighbor-aware edge adjustment values to derive adjusted edge fragments.

5. The method recited in claim 4, further comprising:
repeating, by using the adjusted edge fragments to replace the edge fragments, the determining, the computing, the combining and the adjusting.

6. The method recited in claim 3, further comprising:
modifying the combined neighbor-aware edge adjustment values if necessary based on constraints comprising mask rule checking.

7. The method recited in claim 3, wherein the combining comprises averaging the neighbor-aware edge adjustment values and the conventional edge adjustment values based on a weight factor.

8. The method recited in claim 7, wherein the weight factor is location dependent or edge type dependent.

9. The method recited in claim 3, wherein the conventional edge adjustment values are derived by a process comprising multiplying the edge placement error values by a feedback factor.

10. The method recited in claim 9, wherein the feedback factor is location dependent or edge type dependent.

11. The method recited in claim 1, wherein the determining edge placement error values is further based on the edge fragment correlation information.

12. The method recited in claim 1, wherein the determining comprises:
performing simulation to derive preliminary edge placement error values; and
deriving the edge placement error values by calculating weighted averages of the preliminary edge placement error values of neighboring edge fragments based on the edge fragment correlation information, the edge fragment correlation information comprising cross-Mask Error Enhancement Factor information or image amplitude sensitivity information.

13. The method recited in claim 1, wherein the computing is further based on one or more constraints, the one or more constraints comprising maximum value or values for the preliminary neighbor-aware edge adjustment values, or constraints defined by mask rule checking, or both.

14. The method recited in claim 13, wherein the computing further comprises:
modifying the neighbor-aware edge adjustment values if necessary based on the constraints defined by mask rule checking.

15. The method recited in claim 1, wherein the predetermined condition is a number of edge fragments closest to the center edge fragment.

16. The method recited in claim 1, wherein the layout design is for a portion of a circuit design.

17. The method recited in claim 1, wherein the layout design is derived by performing one or more conventional optical proximity correction iterations on an original layout design.

18. A non-transitory processor-readable medium storing processor-executable instructions for causing one or more processors to perform a method, the method comprising:
determining edge placement error values for edge fragments in a layout design based on simulation; and
computing neighbor-aware edge adjustment values for the edge fragments based on the edge placement error values and edge fragment correlation information, wherein the computing comprises:
selecting a group of edge fragments from the edge fragments, the group of edge fragments comprising a center edge fragment and edge fragments neighboring the center edge fragment determined based on a predetermined condition,
calculating preliminary neighbor-aware edge adjustment values based on the edge placement error values for the group of edge fragments and the edge fragment correlation information for the group of edge fragments,
storing the preliminary neighbor-aware edge adjustment values for the center edge fragment or a plurality of edge fragments as the neighbor-aware edge adjustment values for the center edge fragment or the plurality of edge fragments, the plurality of edge fragments being a subgroup of edge fragments in the group of edge fragments that include the center edge fragment, and
repeating the selecting, the calculating and the storing for different groups of edge fragments.

19. The non-transitory processor-readable medium recited in claim 18, wherein the repeating is performed with each of the edge fragments serving as the center edge fragment.

20. The non-transitory processor-readable medium recited in claim 18, wherein the method further comprises:
combining the neighbor-aware edge adjustment values and conventional edge adjustment values to derive combined neighbor-aware edge adjustment values for the edge fragments.

21. The non-transitory processor-readable medium recited in claim 20, wherein the method further comprises:
adjusting the edge fragments in the layout design according to the combined neighbor-aware edge adjustment values to derive adjusted edge fragments.

22. The non-transitory processor-readable medium recited in claim 20, wherein the method further comprises:
repeating, by using the adjusted edge fragments to replace the edge fragments, the determining, the computing, the combining and the adjusting.

23. The non-transitory processor-readable medium recited in claim 20, wherein the combining comprises averaging the neighbor-aware edge adjustment values and the conventional edge adjustment values based on a weight factor.

24. The non-transitory processor-readable medium recited in claim 20, wherein the conventional edge adjustment values are derived by a process comprising multiplying the edge placement error values by a feedback factor.

25. The non-transitory processor-readable medium recited in claim 20, wherein the method further comprises:
modifying the combined neighbor-aware edge adjustment values if necessary based on constraints comprising mask rule checking.

26. The non-transitory processor-readable medium recited in claim 18, wherein the determining edge placement error values is further based on the edge fragment correlation information.

27. The non-transitory processor-readable medium recited in claim 18, wherein the determining comprises:
performing simulation to derive preliminary edge placement error values; and
deriving the edge placement error values by calculating weighted averages of the preliminary edge placement error values for neighboring edge fragments based on the edge fragment correlation information, the edge fragment correlation information comprising cross-Mask Error Enhancement Factor information or image amplitude sensitivity information.

28. The non-transitory processor-readable medium recited in claim 18, wherein the computing is further based on one or more constraints, the one or more constraints comprising maximum value or values for the preliminary neighbor-aware edge adjustment values, or constraints defined by mask rule checking, or both.

29. The non-transitory processor-readable medium recited in claim 28, wherein the computing further comprises:
modifying the neighbor-aware edge adjustment values if necessary based on the constraints defined by mask rule checking.

30. A system, comprising:
one or more processors, the one or more processors programmed to perform a method, the method comprising:
determining edge placement error values for edge fragments in a layout design based on simulation; and
computing neighbor-aware edge adjustment values for the edge fragments based on the edge placement error values and edge fragment correlation information, wherein the computing comprises:
selecting a group of edge fragments from the edge fragments, the group of edge fragments comprising a center edge fragment and edge fragments neighboring the center edge fragment determined based on a predetermined condition,
calculating preliminary neighbor-aware edge adjustment values based on the edge placement error values for the group of edge fragments and the edge fragment correlation information for the group of edge fragments,
storing the preliminary neighbor-aware edge adjustment values for the center edge fragment or a plurality of edge fragments as the neighbor-aware edge adjustment values for the center edge fragment or the plurality of edge fragments, the plurality of edge fragments being a subgroup of edge fragments in the group of edge fragments that include the center edge fragment, and
repeating the selecting, the calculating and the storing for different groups of edge fragments.

* * * * *